United States Patent
Beaber et al.

(10) Patent No.: US 9,463,428 B2
(45) Date of Patent: Oct. 11, 2016

(54) PALLADIUM-BASED CATALYST AND SUPPORT SYSTEMS

(71) Applicant: 3M INNOVATIVE PROPERTIES COMPANY, St. Paul, MN (US)

(72) Inventors: Aaron R. Beaber, Minneapolis, MN (US); Badri Veeraraghavan, Woodbury, MN (US); Evan Koon Lun Yuuji Hajime, Woodbury, MN (US); Thomas E. Wood, Stillwater, MN (US); Amy S. Barnes, Saint Paul, MN (US)

(73) Assignee: 3M INNOVATIVE PROPERTIES COMPANY, Saint Paul, MN (US)

( * ) Notice: Subject to any disclaimer, the term of this patent is extended or adjusted under 35 U.S.C. 154(b) by 0 days.

(21) Appl. No.: 14/367,537

(22) PCT Filed: Dec. 17, 2012

(86) PCT No.: PCT/US2012/070005
§ 371 (c)(1),
(2) Date: Jun. 20, 2014

(87) PCT Pub. No.: WO2013/096156
PCT Pub. Date: Jun. 27, 2013

(65) Prior Publication Data
US 2015/0209746 A1    Jul. 30, 2015

Related U.S. Application Data

(60) Provisional application No. 61/578,729, filed on Dec. 21, 2011.

(51) Int. Cl.
*B01J 23/44* (2006.01)
*B01J 23/54* (2006.01)
(Continued)

(52) U.S. Cl.
CPC ............. *B01J 8/0285* (2013.01); *B01J 8/0278* (2013.01); *B01J 23/44* (2013.01); *B01J 23/54* (2013.01);
(Continued)

(58) Field of Classification Search
CPC .......... B01J 37/12; B01J 23/44; B01J 23/63; B01J 23/54
USPC ........................................ 568/956
See application file for complete search history.

(56) References Cited

U.S. PATENT DOCUMENTS

| 5,425,632 A | 6/1995 | Kazunori |
| 5,993,192 A | 11/1999 | Schmidt |

(Continued)

FOREIGN PATENT DOCUMENTS

| CA | 2150105 | 1/1994 |
| CN | 1332035 A | 1/2002 |

(Continued)

OTHER PUBLICATIONS

Lukyanov et al, Chemical Engieering Journal 154 (2009), pp. 258-266.*

(Continued)

*Primary Examiner* — Kamal Saeed
*Assistant Examiner* — Janet L Coppins
(74) *Attorney, Agent, or Firm* — C. Michael Geise

(57) ABSTRACT

Described are catalyst compositions, oxidizable-gas burner systems, methods of oxidizing oxidizable gas, and methods of preparing catalyst compositions and oxidizable-gas burner systems.

7 Claims, 3 Drawing Sheets

100 nm

(51) Int. Cl.
*B01J 8/02* (2006.01)
*B01J 37/02* (2006.01)
*B01J 23/63* (2006.01)
*B01J 23/656* (2006.01)
*B01J 35/00* (2006.01)
*B01J 35/02* (2006.01)
*C23C 14/16* (2006.01)

(52) U.S. Cl.
CPC ............ *B01J 23/63* (2013.01); *B01J 23/6562* (2013.01); *B01J 35/002* (2013.01); *B01J 35/006* (2013.01); *B01J 35/0013* (2013.01); *B01J 35/023* (2013.01); *B01J 37/0238* (2013.01); *C23C 14/16* (2013.01); *B01J 2208/00805* (2013.01)

(56) References Cited

U.S. PATENT DOCUMENTS

| | | |
|---|---|---|
| 6,447,285 B1 | 9/2002 | Bertolini et al. |
| 6,984,750 B2 | 1/2006 | Chaturvedi et al. |
| 7,045,670 B2 | 5/2006 | Johnson et al. |
| 8,603,203 B2 | 12/2013 | Shin et al. |
| 2007/0037698 A1 | 2/2007 | Watkins et al. |

FOREIGN PATENT DOCUMENTS

| | | |
|---|---|---|
| CN | 101116815 A | 2/2008 |
| CN | 101217197 A | 7/2008 |
| CN | 101327436 A | 12/2008 |
| JP | 56062541 | 5/1981 |
| JP | 59041706 | 3/1984 |
| JP | 63004852 | 1/1988 |
| JP | 2000-292397 A | 10/2000 |
| KR | 10-0888018 | 3/2009 |
| WO | WO 97/43042 A1 | 11/1997 |
| WO | WO 2010/043189 A2 | 4/2010 |

OTHER PUBLICATIONS

Roche, V. et al., "Electrochemical promotion of deep oxidation of methane on Pd/YSZ", J. Appl. Electrochem. 2008, vol. 38, Issue 8, 1111-1119.*
Horwat, D., et al., "Deep oxidation of methane on particles derived from YSZ-supported Pd—Pt—(O) coatings synthesized by Pulsed Filtered Cathodic Arc", Catalysis Communications, vol. 10, (2009) pp. 1410-1413.
Cerri, "Premixed metal fiber burners based on a pd catalyst," Catalysis Today, 2003, vol. 83, pp. 19-31.
Farrauto, "Catalytic chemistry of supported palladium for combustion of methane," Applied Catalysis A: General, 1992, vol. 81, pp. 227-237.
Gelin, "Complete oxidation of methane at low temperature over noble metal based catalysts: a review," Applied Catalysis B: Environmental, 2002, vol. 39, pp. 1-37.
Haneda, "Synergistic effect between Pd and nonstoichiometric cerium oxide for oxygen activation in methane oxidation," J. Phys. Chem. B, 1998, vol. 102, pp. 6579-6587.
Horwat, "Chemistry, phase formation, and catalytic activity of thin palladium-containing oxide films synthesized by plasma-assisted physical vapor deposition", Surface and Coatings Technology, 2011, vol. 205, pp. S171-S177.
International Search Report for International Application No. PCT/US2012/070005, mailed on Apr. 30, 2013, 4 pages.
Lai, "Methane-fueled thin film micro-solid oxide fuel cells with nanoporous palladium anodes", Journal of Power Sources, 2011, vol. 196, No. 15, pp. 6299-6304.
Roche, "Electrochemical promotion of deep oxidation of methane on Pd/YSZ," J. Appl Electrochem, 2008, vol. 38, pp. 1111-1119.
Specchia, "Effect of S-compounds on Pd over $LaMnO_3 \cdot 2ZrO_2$ and $CeO_2 \cdot 2ZrO_2$ catalysts for $CH_4$ combustion," Catalysis Today, 2009, vol. 143, pp. 86-93.
Specchia, "Natural gas combustion catalysts for environmental-friendly domestic burners," Catalysis Today, 2009, vol. 147S, pp. S99-S106.

* cited by examiner

PALLADIUM-BASED CATALYST AND SUPPORT SYSTEMS

This invention was made with Government support under Contract No. DE-EE0003491, awarded by the Department of Energy. The Government has certain rights in this invention.

FIELD

The present description relates to palladium-based catalyst systems and methods of making palladium-based catalyst systems.

SUMMARY

While a number of active catalyst and support systems for methane combustion have been described, the present applicants have identified two major shortcomings with such systems. First, the catalysts used are quite expensive and the loading levels required to achieve catalytic activity can be high enough to make such systems of limited commercial interest. Further, catalyst systems available today suffer from poor long term thermal stability.

The present description provides compositions and methods of making compositions that, in some embodiments, provide high-activity for hydrocarbon oxidation, especially methane oxidation. In some embodiments, such catalyst systems require very low loading levels of precious metal, in particular palladium. Applications for such compositions and methods of use include use in boilers or radiant burners for industrial applications and commercial buildings.

The use of physical vapor deposition methodologies to deposit palladium metal on a support medium, in particular embodiments on an activating support medium, and in some cases, as described below, a nanoporous support medium, can, in some embodiments, provide catalytic systems that are highly active for hydrocarbon oxidation, especially methane oxidation.

In one aspect, the present description relates to an oxidizable-gas burner system comprising an oxidizable gas source; a heat source; and a catalyst system. The catalyst system comprises a support medium; and a palladium metal physically vapor deposited on the support medium. The oxidizable gas source is in fluid communication with the heat source and the catalyst system is situated proximate to the heat source.

In another aspect, the present description relates to a method comprising providing a support medium; physically vapor depositing a palladium metal on the support medium to provide a catalyst; and contacting the catalyst with an oxidizable gas.

In a further aspect, the present description provides a method comprising providing an oxidizable-gas burner system according to any aspect of the present description; and contacting the catalyst system with an oxidizable gas.

DETAILED DESCRIPTION

Figure 1:
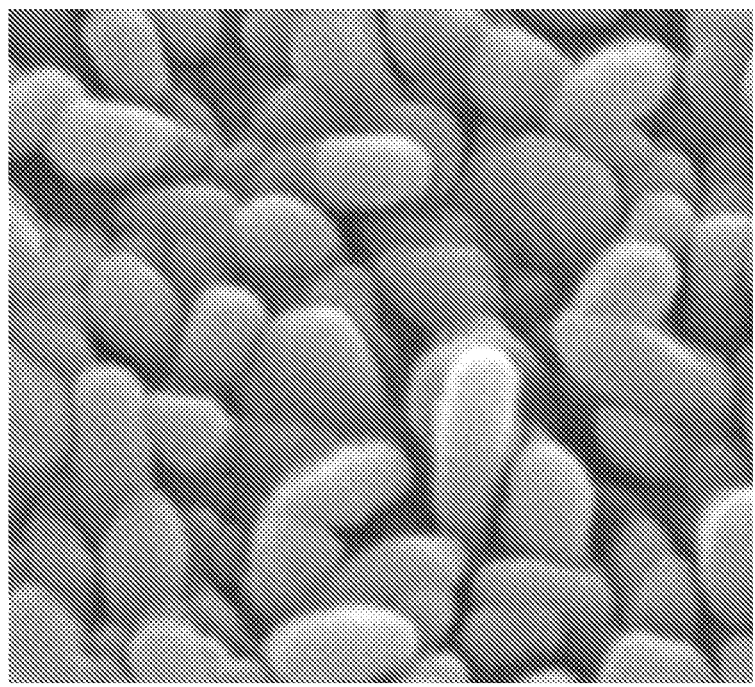
FIG. 1 is a secondary electron image of an FeCrAl substrate coated with $ZrO_2$ support and Pd catalyst.

The embodiments of the present description are chosen and described so that others skilled in the art may appreciate and understand the principles and practices of the present description.

In the practice of the present description, catalytically active palladium is deposited onto a support medium using physical vapor deposition. Physical vapor deposition refers to the physical transfer of palladium from a palladium-containing source or target to the support medium. Physical vapor deposition may be viewed as involving atom-by-atom deposition, although in actual practice, the palladium may be transferred as extremely fine bodies constituting more than one atom per body. Once at the surface of the support medium, the palladium may interact with the surface physically, chemically, ionically, and/or otherwise.

Physical vapor deposition typically occurs under temperature and vacuum conditions in which the palladium is very mobile. Consequently, the palladium is quite mobile and will tend to migrate on the surface of the support medium until immobilized in some fashion, e.g., by adhering to a site on or very near the support medium surface. It is believed that sites of adhering can include defects such as surface vacancies, structural discontinuities such as steps and dislocations, interfacial boundaries between phases, crystals, or other palladium species such as small palladium clusters. The deposited palladium is immobilized effectively in a manner in which the palladium retains a high level of catalytic activity. This is contrasted to those conventional solution-based methodologies, for example use of wash coatings, impregnation, incipient wetness, in which the deposition of the active palladium is not well controlled. Commonly in these processes, palladium is wasted by deposition on areas of the support where the catalyst does not contribute to burner activity during use. In addition, in these solution techniques, a common problem is segregation of the catalyst precursor solution during drying so that it is very difficult to control the size, the distribution and the location of the catalyst particles that are generated.

There are different approaches for carrying out physical vapor deposition (sometimes referred to herein as PVD). Representative approaches include sputter deposition, evaporation, and cathodic arc deposition. Any of these or other PVD approaches may be used, although the nature of the PVD technique used can impact catalytic activity. For instance, the energy of the physical vapor deposition technique used can impact the mobility, and hence tendency of the deposited palladium atoms and clusters to agglomerate into larger bodies on the surface of the support. Higher energy tends to correspond to an increased tendency of the palladium to agglomerate. Increased agglomeration, in turn, tends to reduce catalytic activity. Generally, the energy of the depositing species is lowest for evaporation, higher for sputter deposition (which may include some ion content in which a small fraction of the impinging metal species are ionized), and highest for cathodic arc (which may be several tens of percents of ion content). Accordingly, if a particular PVD technique yields deposited palladium that is more mobile than might be desired, it may be useful to use a PVD technique of lesser energy instead.

Physical vapor deposition generally is a line of sight/ surface coating technique between the palladium source and the support medium. This means that only the exposed, outer surfaces of the support medium, but not inner pores (if any) that are well within the substrate, are directly coated. While the inner surfaces not in a direct line of sight with the source will also tend not to be directly coated with palladium, on some substrates, the atoms and small clusters of the deposited palladium can penetrate by diffusion a small distance into a porous support medium The total thickness of the palladium, or $C_t$, is equal to the palladium penetration depth plus the thickness of the palladium that is deposited on the surface of the support medium and that has not penetrated by diffusion.

In yet further embodiments, the active palladium species may be collected essentially completely on the outermost portion of the support medium. This can be desirable since this is the surface of the catalyst system that interacts most readily with an oxidizable gas, for instance in a burner system.

The palladium metal may be in the form of metal, an oxide, or some other oxidized form, and may have an oxidation state of, for instance, 0, +2, or +4. In general, it is preferable that at least a portion of the palladium be present in an oxidized form during the periods where the catalyzed burner is promoting combustion.

Characterization of the surface of the support medium and the palladium is accomplished using scanning electron microscopy (SEM) or by transmission electron microscopy (TEM), as is well-known in the catalyst art.

SEM images of a representative catalyst surface is shown in FIG. 1. In FIG. 1 (a secondary electron image), an image is shown of a FeCrAl substrate coated with $ZrO_2$ support medium and palladium metal.

As a consequence of line of sight coating, the catalyst system may, from one perspective, be viewed as a support medium (for instance a nanoporous support medium) having relatively thin shells of discontinuous, catalytic palladium on and proximal to the outer surfaces of the support medium.

The palladium metal that is physically vapor deposited on the support medium may, in some embodiments, have a minor dimension of from 0.1 nm to 500 nm, from 1 nm to 400 nm, or even from 5 to 250 nm. By minor dimension it is meant the dimension having the smallest aspect measurement. Recognizing that, in some embodiments, the palladium forms a layer bound to the surface of a substrate, in such instance the minor dimension may be, for instance, the thickness of the layer. In other embodiments, however, the minor dimension may be parallel to the major surface of the substrate medium.

Figure 2:
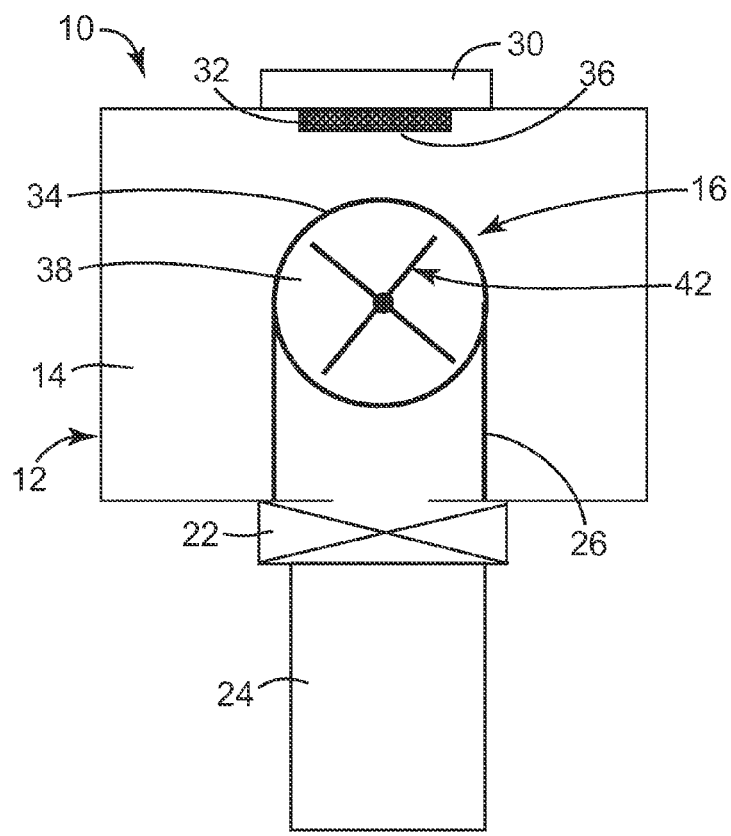
FIG. 2 is a schematic side view of an apparatus for carrying out a PVD process.
Figure 3:
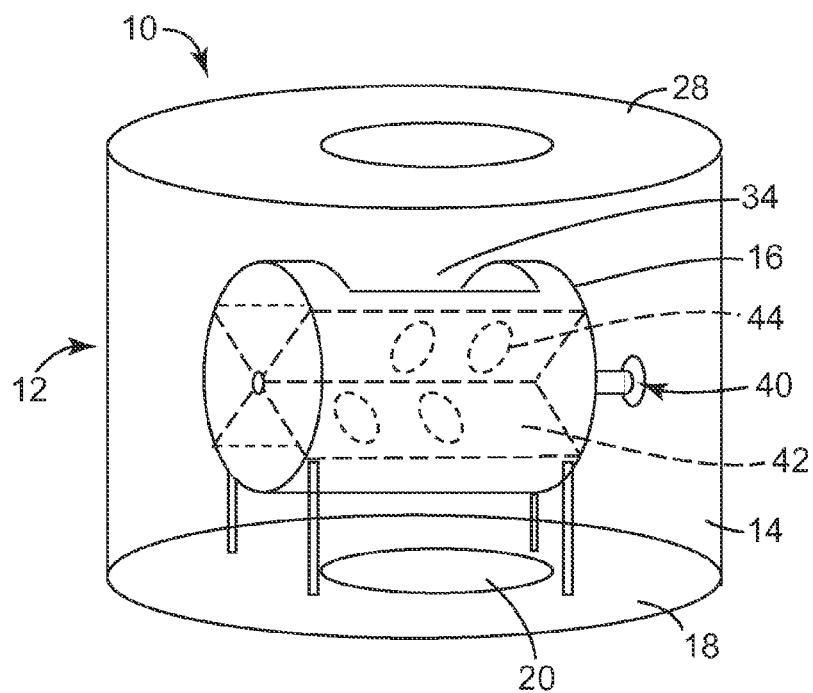
FIG. 3 is a schematic perspective view of the apparatus of FIG. 2.

An apparatus (10) for carrying out a PVD process is shown in FIGS. 2 and 3. Apparatus (10) includes housing (12) defining vacuum chamber (14) containing a particle agitator (16). Housing (12), which may be made from an aluminum alloy if desired, is a vertically oriented hollow cylinder. Base (18) contains port (20) for high vacuum gate valve (22) followed by (24) (which may be, for instance, a diffusion pump) as well as support (26) for particle agitator (16). Chamber (14) is capable of being evacuated to background pressures in the range of $10^{-6}$ torr (1.3 mPa).

The top of housing (12) includes demountable, rubber L-gasket sealed plate (28) that is fitted with an external mount three-inch (7.6 cm) diameter dc magnetron sputter deposition source (30). Into source (30) is fastened palladium sputter target (32).

Particle agitator (16) may, in specific embodiments, be a hollow cylinder with rectangular opening (34) in top (36).

Opening (34) is positioned directly below surface (36) of palladium sputter target (32) so that sputtered palladium atoms can enter agitator volume (38). Agitator (16) is fitted with shaft (40) aligned with the axis of agitator (16). Shaft (40) has a rectangular cross section to which are bolted four rectangular blades (42) which form an agitation mechanism or paddle wheel for the support particles being tumbled. Blades (42) may optionally each contain two holes (44) to promote communication between the particle volumes contained in each of the four quadrants formed by blades (42) and agitator (16). The dimensions of blades (42) are selected to give appropriate side and end gap distances with the agitator walls (48). Specific modes of use of this apparatus are described below in the Examples.

Physical vapor deposition may be carried out at any desired temperature(s) over a very wide range of temperatures for e.g from −200 C to +600 C. A bias (usually negative) electric potential applied to the substrate during deposition can also influence the film properties and coverage.

The amount of palladium provided on a support medium can vary over a wide range. From a practical perspective, however, it is helpful to consider and balance a number of factors when choosing a desired weight loading. For instance, palladium is herein observed to be highly active for hydrocarbon oxidation, especially methane oxidation, when provided on a support medium (for instance on a nanoporous support medium). Thus, in some embodiments, only very low weight loadings are needed to achieve good catalytic performance. For economic reasons, it would be desirable to only use as much palladium as is reasonably needed to achieve the desired degree of catalytic activity. With such factors in mind, and as general guidelines, the palladium metal may be present at from 0.001 to 5 weight percent palladium, from 0.01 to 1 weight percent palladium, or even from 0.04 to 0.5 weight percent palladium based on the total weight of the palladium and the support medium.

In the practice of the present description, palladium may be deposited onto one or more nanoporous support media to thereby form a heterogeneous catalyst system. Nanopores can be observed and nanopore size can be measured via transmission electron microscopy. The nanoporous nature of a support may also be characterized by TEM or by a technique such as described in ASTM Standard Practice D 4641-94 in which nitrogen desorption isotherms are used to calculate the pore size distribution of catalysts and catalyst supports in the range from about 1.5 to 100 nm. Nanoporous means that the total nanoporous capacity for pores in the size range of 1 to 10 nm is greater than 20% (i.e., greater than about 0.20 using the formula below) of the total pore volume of the support material in the range from 1 to 100 nm as calculated using the following formula with data obtained from ASTM D4641-94:

$$NPC = \frac{CPv_1 - CPv_{10}}{CPv_1 - CPv_{100}}$$

NPC—Nanoporous Capacity $CPv_n$—Cumulative Pore Volume at Pore Radius '$n$' ($mm^3/g$) $\times 10^{-3}$ $n$—Pore Radius (in nanometers)

In some embodiments, the nanoporous characteristic of the support medium may immobilize palladium metal on the support medium surface. This stabilization may be evidenced by both the direct observation of smaller particles of palladium in TEM imaging and in higher catalytic activity as measured by the ability of a catalyst system to oxidize an oxidizable gas. Advantageously, palladium is, in some embodiments, deposited onto a support medium using PVD, in particular a nanoporous support medium, in a catalytically active state without requiring additional thermal or other treatment for activation. In addition to nanoporosity, the support medium optionally may further have microporous, mesoporous, and/or macroporous characteristics.

In particular embodiments, the support medium may be an activating nanoporous support medium.

In particular embodiments, where support medium materials are nanoporous, it may be advantageous for the material to be nanoporous only in the exterior surface region of the support medium. In this spirit, support media may include those materials with nominally low surface area, made into materials possessing exterior surfaces characterized by nanoporosity. Methods for such conversion include adsorption of nanoporous materials such as gels and nanoparticle size colloids on the surface of a support medium material to form a nanoporous support medium material; hydrolysis of metal alkoxides or metal salts on the surface of a material to form a nanoporous support medium material; dry or wet etching of the surface of a support medium material; and oxidation of a thin coating of metal, e.g., aluminum, titanium, tin, antimony or the like, on the surface of a material to form a nanoporous support medium material. In the latter case, the thin metal films can be deposited by physical vapor methods and the oxidation can be carried out by dry or moist air to produce a nanoparticle film on a substrate.

A wide variety of materials may serve as a suitable support medium. Representative examples include metal compounds such as metal oxides, nitrides, or carbides, combinations of these, alloys, and the like. Representative metal oxides (or nitrides or carbides) include oxides (or nitrides or carbides) of one or more of silicon, magnesium, aluminum, titanium, vanadium, chromium, manganese, iron, cobalt, nickel, cerium, copper, zinc, gallium, germanium, strontium, yttrium, zirconium, niobium, molybdenum, ruthenium, rhodium, silver, cadmium, samarium, thorium, indium, iron, tin, antimony, barium, lanthanum, hafnium, thallium, tungsten, rhenium, osmium, iridium, platinum, and alloys and mixtures or combinations thereof.

Support media may be deposited on a substrate. Selection of suitable substrate materials may be based on a number of considerations, including thermal stability at oxidizing temperatures, interaction with the support medium, ability to abate catalyst poisoning, and the like. Suitable examples of substrates include metals, metal oxides, and alloys. Of particular utility are thermally stable ceramics (e.g., ceramics and ceramic composites comprising alumina, aluminates, silicon carbide, mullite, cordierite) and refractory metal alloys (e.g., FeCrAl, high nickel alloys (e.g., Hastelloy™), austenitic nickel chromium based super alloy (including Inconel™)).

The form or geometry of the substrate may be chosen as to be useful in an oxidizable-gas burner system, and may include such forms as fiber mesh, knits, fabrics, foams, beads (including beads within a packed bed), porous ceramic bodies (e.g., reticulated foams), and the like.

Burner systems contemplated in the present description include a system comprising a fuel and an oxidizer source and a means for generating a combustion reaction. These systems can also include equipment to mix the fuel and oxidizer prior to combustion; blowers to control the oxidizer input and to accelerate gas flow; and diffusion equipment to spread the combustion evenly over a given surface. In one particular embodiment, clean dry air and methane may be regulated with mass flow controllers before passing through a mixing chamber and then a perforated head, to which the catalyzed system is attached.

Oxidizable gasses contemplated in the present description are not particularly limited, and include those finding utility in industrial and commercial settings. Oxidizable gasses may include acetylene, methane, ethane, propane, butane, and pentane.

The present descriptions relates, in other aspects, to a method comprising providing a support medium as described herein, and vapor depositing a palladium metal on the support medium. This method may provide a catalyst, wherein the palladium has a minor dimension of from 1 nm to 500 nm. The method further comprises contacting the catalyst with an oxidizable gas. Such contacting may occur, for instance, in the presence of a burner (such as a radiant burner) or other suitable heat source so as to cause the oxidation (or combustion) of the oxidizable gas.

In some embodiments, oxidizable-gas burner systems and methods according to the present description may provide improved catalytic oxidizing activity (also referred to as "combustion activity") with regard to an oxidizable gas. In particular, the $T_{50}$, which is the temperature at which 50% of the oxidizable gas is oxidized when in fluid communication with the heat source and the catalyst system is situated proximate to the heat source, may be lower compared to catalyst systems containing similar weight percentages of palladium metal, but which comparative catalyst systems are prepared, for instance, by solution coating instead of the physical vapor deposition described herein. Details of this effect are illustrated in the Examples.

Figure 4:
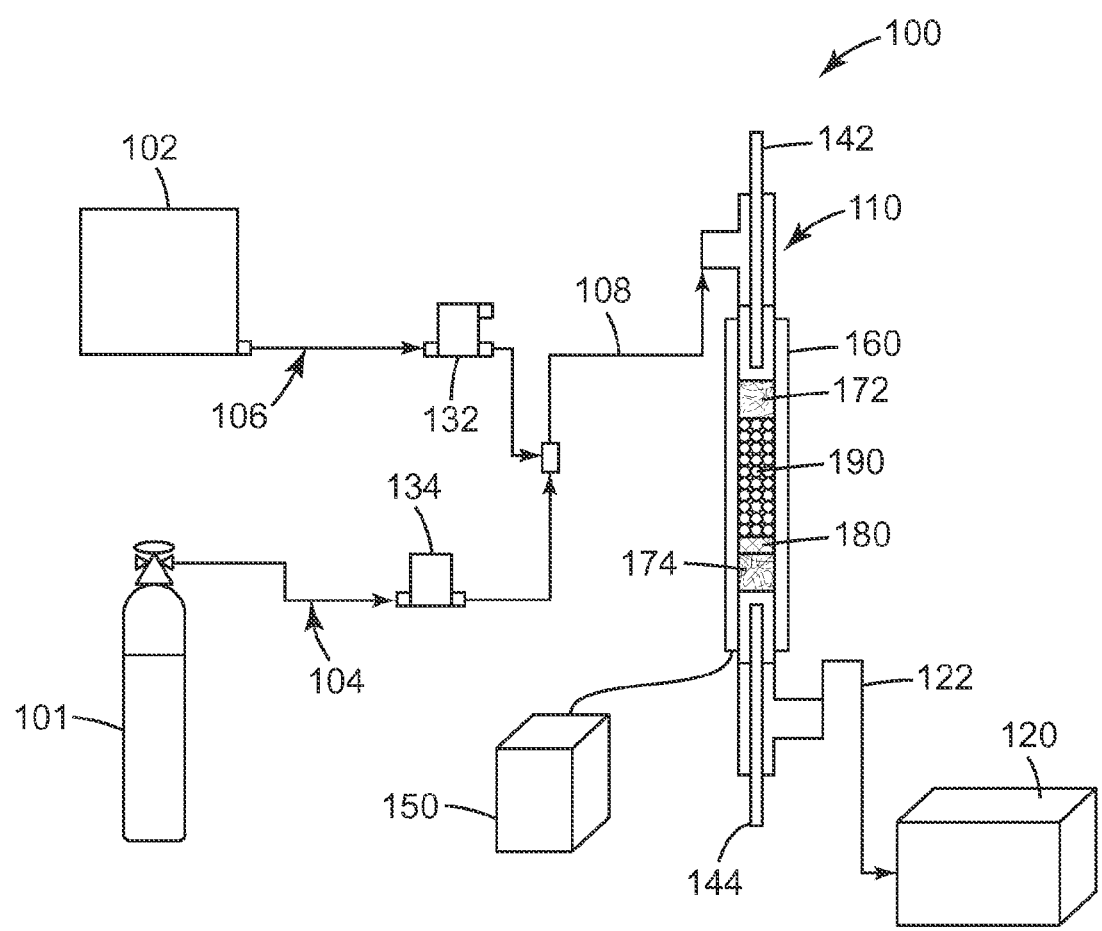
FIG. 4 shows testing system that was used to measure methane conversion as a function of reactor temperature in order to assess catalytic characteristics for oxidizing methane.

FIG. 4 shows testing system (100) that was used to assess catalytic characteristics for oxidizing methane. Catalyst activity was determined using stainless steel reactor tube (110) heated by heat tape (160). Catalyst (190) samples were loaded into stainless steel reactor tube (110). Catalyst (190) is supported on a disc of fine stainless steel mesh (180) welded to stainless steel reactor tube (110). Glass wool (172) is placed at the bottom of mesh (180), and also at the top of catalyst (190). Air source (102) and natural gas source (101) were controlled by mass flow controller (132) and (134), respectively. Air flow (106) and natural gas flow (104) were combined into feed (108) for introduction into reactor (110).

Analysis of reaction product (122) may be performed by detector (120). Detector (120) may be, for instance, a gas chromatograph. The temperature of reactor (110) may be measured by leading thermocouple (142) and trailing thermocouple (144).

The temperature of reactor (110) may be controlled by multi-zone temperature controller (150), which controls heating tape (160).

Further, in other embodiments, oxidizable-gas burner systems and methods according to the present description may hold oxidation (or combustion) at the catalyst system surface rather than as an open flame.

In yet further embodiments, the catalyst systems of the present description may exhibit long term thermal stability. Such thermal stability may be characterized in the maintenance of a minimal level of activity after exposure to high temperatures. One physical change that can be readily observed is whether a catalyst system maintains a maximum critical dimension of the palladium catalyst after exposure to high temperatures. The maintenance of such maximum critical dimension may, in some embodiments, correspond to the maintenance of catalyst activity. For instance, in some embodiments, the catalyst systems of the present description have an average critical dimension of less than 500 nm after exposure to temperatures of 800° C., of 900° C., or even of 1000° C.

The present description can be described in the following embodiments:

Embodiment 1

An oxidizable-gas burner system comprising:
an oxidizable gas source,
a heat source, and
a catalyst system comprising:
(i) a support medium; and
(ii) a palladium metal physically vapor deposited on the support medium;
wherein the oxidizable gas source is in fluid communication with the heat source and the catalyst system is situated proximate to the heat source.

Embodiment 2

The system according to embodiment 1, wherein the palladium metal is present at from 0.001 to 5 weight percent palladium based on the total weight of the palladium and the support medium.

Embodiment 3

The system according to any of the previous embodiments, wherein the palladium metal is present from 0.001 to 1 weight percent palladium based on the total weight of the palladium and the support medium.

Embodiment 4

The system according to any of the previous embodiments, wherein the palladium metal is present from 0.04 to 0.5 weight percent palladium based on the total weight of the palladium and the support medium.

Embodiment 5

The composition according to any of the previous embodiments, wherein the support medium is an activating nanoporous support medium.

Embodiment 6

The system according to any of the previous embodiments, wherein at least 80 percent by weight of the palladium based on the total weight of the palladium and the support medium is deposited on the surface of the support medium.

Embodiment 7

The system according to any of the previous embodiments, wherein at least 90 percent by weight of the palladium based on the total weight of the palladium and the support medium is deposited on the surface of the support medium.

Embodiment 8

The system according to any of the previous embodiments, wherein at least 95 percent by weight of the palladium based on the total weight of the palladium and the support medium is deposited on the surface of the support medium.

Embodiment 9

The system according to any of the previous embodiments, wherein at least 99 percent by weight of the palladium based on the total weight of the palladium and the support medium is deposited on the surface of the support medium.

Embodiment 10

The system according to any of the previous embodiments, wherein at least 99.5 percent by weight of the palladium based on the total weight of the palladium and the support medium is deposited on the surface of the support medium.

Embodiment 11

The system according to any of the previous embodiments, wherein the support medium comprises an oxide of a metal selected from the group consisting of silicon, magnesium, aluminum, titanium, vanadium, chromium, manganese, iron, cobalt, nickel, cerium, copper, zinc, gallium, germanium, strontium, yttrium, zirconium, niobium, molybdenum, ruthenium, rhodium, silver, cadmium, samarium, indium, tin, antimony, barium, lanthanum, hafnium, thallium, tungsten, rhenium, osmium, iridium, platinum, and alloys and mixtures thereof.

Embodiment 12

The system according to any of the previous embodiments, wherein the support medium comprises an oxide of a metal selected from the group consisting of silicon, magnesium, aluminum, titanium, vanadium, chromium, manganese, cobalt, nickel, cerium, copper, zinc, gallium, strontium, yttrium, zirconium, niobium, molybdenum, ruthenium, silver, samarium, indium, iron, barium, lanthanum, hafnium, tungsten, platinum, iridium, rhodium, and alloys and mixtures thereof.

Embodiment 13

The system according to any of the previous embodiments, wherein the support medium comprises an oxide of zirconium.

Embodiment 14

The system according to any of the previous embodiments, wherein the support medium comprises an oxide of titanium.

Embodiment 15

The system according to any of the previous embodiments, wherein the support medium comprises an oxide of manganese.

Embodiment 16

The system according to any of the previous embodiments, wherein the support medium comprises an oxide of cerium, optionally further comprising a mixture with aluminum oxide.

Embodiment 17

The system according to any of the previous embodiments, wherein the support medium comprises an oxide of a mixture of titanium, zirconium and manganese.

Embodiment 18

The system according to any of the previous embodiments, wherein the support medium comprises an oxide of aluminum.

Embodiment 19

The system according to embodiment 1, wherein the palladium metal has an oxidation state selected from +2 and +4.

Embodiment 20

A method comprising:
providing a support medium,
physically vapor depositing a palladium metal on the support medium to provide a catalyst, and
contacting the catalyst with an oxidizable gas.

Embodiment 21

The method according to embodiment 20 wherein the contacting occurs in a burner system.

Embodiment 22

The method according to embodiment 20 or 21 further comprising applying an electrical bias to the substrate during the physically vapor depositing the palladium metal.

Embodiment 23

The method according to any of embodiments 20 to 22 further comprising exposing the catalyst to a temperature of 800° C., wherein the palladium metal maintains a critical dimension of less than 500 nm after the exposing.

Embodiment 24

The method according to any of embodiments 20 to 22 further comprising exposing the catalyst to a temperature of 900° C., wherein the palladium metal maintains a critical dimension of less than 500 nm after the exposing.

Embodiment 25

The method according to any of embodiments 20 to 22 further comprising exposing the catalyst to a temperature of 1000° C., wherein the palladium metal maintains a critical dimension of less than 500 nm after the exposing.

Embodiment 26

A method comprising:
providing a system according to any of embodiments 1 to 19, and
contacting the catalyst system with an oxidizable gas.

Embodiment 27

The method of either embodiment 26, wherein the oxidizable gas is methane and further wherein the T50 is below 400° C. and the palladium is present in an amount of from 0.001 to 5 weight percent palladium based on the total weight of the palladium and the support medium.

Embodiment 28

The method of either embodiment 26, wherein the oxidizable gas is methane and further wherein the T50 is below 400° C. and the palladium is present in an amount of from 0.001 to 1 weight percent palladium based on the total weight of the palladium and the support medium.

Embodiment 29

The method of embodiment 26, wherein the oxidizable gas is methane and further wherein the T50 is below 400° C. and the palladium is present in an amount of from 0.04 to 0.5 weight percent palladium based on the total weight of the palladium and the support medium.

The present description will now be further described in the following illustrative examples.

EXAMPLES

Advantages and embodiments of this disclosure are further illustrated by the following examples, but the particular materials and amounts thereof recited in these examples, as well as other conditions and details, should not be construed to unduly limit this invention. In these examples, all percentages, proportions and ratios are by weight unless otherwise indicated.

These abbreviations are used in the following examples: g=gram, min=minutes, in=inch, m=meter, cm=centimeter, mm=millimeter, l=liter, ml=milliliter, and Pa=Pascal.

Test Methods:
Methane Oxidation Activity

Catalysts prepared as described in Comparative Example A and Examples 1-5, below, were tested for methane oxidation activity using the testing system shown in FIG. 4. The catalysts were packed into the reactor tube (110) using a vibratory feeder (not shown) (obtained under the trade designation "SYNTRON Magnetic Feeder (FT0-C)" from FMC Technologies, Houston, Tex.), and an electronic controller, resulting in a total catalyst bed volume of 25 ml. The catalysts were placed onto the stainless steel mesh (180). Compressed methane gas (Praxair, 99.0% CP grade) and filtered compressed air were premixed prior to introduction into the reactor space, where mass flow controllers were used to control the flow rates of the respective reactant gases. The volumetric flow rates of methane and air were adjusted to produce a challenge premix of 1000 ppm methane in air at a total flow rate of 5 l/min. Under these test conditions, a residence time of 0.3 seconds and gas hourly space velocity of 12,000 $h^{-1}$ were obtained. The exit gas from the reactor was sampled at a rate of approximately 100 ml/min using a micropump (obtained under the trade designation a "RENA AIR 200", from Mars Fishcare, Chalfont, Pa.) directly into the sample loop of a gas chromatograph (model "8610C", from SRI Instruments, Torrance, Calif.). The gas chromatograph was equipped with an automated gas sampling valve and 1 ml sample loop. A 6 in by ⅛ in (15.2 cm by 0.31 cm) stainless steel 13× molecular sieve column (model "8600-PK3B" from SRI instruments) and a flame ionization detector (FID) was used for analysis of the methane concentration (ppm) in the exit gas stream. Calibration of the FID detector for methane concentration was achieved using five calibration gas mixtures of 50, 250, 500, 1000 and 2000 ppm methane in $N_2$, obtained from Oxygen Service Company, St. Paul, Minn. Calculation of the percent conversion of methane was performed using the following formula:

Methane Conversion (%)=[×(ppm)/1000 (ppm)]× 100%, where, x=concentration of methane in the exit gas stream in ppm.

Values of percent conversion of methane at 200, 250, 300, 350, 400, 450 and 500° C. were obtained by allowing the reactor to thermally stabilize at each reactor temperature for 20 minutes prior to sampling of the exit gas. Values of temperature for methane conversion at 50% ($T_{50}$) and 90% ($T_{90}$) were estimated based on the curve generated from the values at the temperatures previously noted.

Palladium Concentration Determination

Palladium concentration in each catalyst prepared as described in Comparative Example A and Examples 1-5, was determined using an inductively coupled plasma-optical emission spectroscopy (ICP-OES) equipment (obtained under the trade designation "OPTIMA 4300DV", from Perkin Elmer, Waltham, Mass.). The catalysts were analyzed against external calibration curves generated using acid-matched solution standards containing 0, 0.5, 1, and 2 ppm of palladium. A 0.5 ppm quality-control standard was used to monitor the accuracy of the calibration curves during the analysis. A 0.5 ppm solution of scandium was run in-line with the samples and standards to serve as an internal standard.

Each catalyst sample was prepared in duplicate. About 100 mg of each catalyst were weighed into acid-washed quartz beakers. About 2 ml of concentrated sulfuric acid were added to the sample beakers and to two empty control beakers. The beakers were covered with acid-washed quartz watch glasses and heated at reflux (approximately 337° C.) for two hours. Next, the beakers were partially uncovered to allow the excess acid to evaporate until a solution volume or approximately 0.5 ml was obtained. About 1 ml of 30% hydrogen peroxide followed by 4 ml of aqua regia (3:1 HCl:$HNO_3$) were added to each beaker, and the solutions were heated to approximately 90-100° C. for 15 minutes. About 10 ml of deionized water were then added, and the solutions were heated gently until the remaining solid had completely dissolved. The samples and controls were cooled, quantitatively transferred into polypropylene centrifuge tubes, diluted to 25 ml with deionized water, and placed into the ICP-OES equipment. Palladium concentration is expressed as weight percent of palladium based on the total weight of the catalyst (palladium and support medium).

Preparation of the Support Media

The following description was used in the preparation of Comparative Example A and Examples 1-5: activated alumina beads having a surface area of 350 $m^2$/g, pore volume of about 0.57 cc/g, and a bulk density of about 0.66-0.75 g/cc (obtained under the trade designation "CSS 350", from Alcoa Industrial Chemicals, Houston, Tex.) were used as support media for palladium deposition. The alumina beads were thoroughly washed in deionized water and annealed at 600° C. before coating with palladium.

Comparative Example A

A 10 wt % $HNO_3$ solution was prepared by mixing 11.47 g of 15.7M $HNO_3$ with 68.48 g of deionized water. Approximately 20.01 g of the 10 wt % $HNO_3$ solution were added to 0.2088 g of palladium nitrate hydrate ($Pd(NO_3)_2 \cdot xH_2O$, Alfa Aesar) to quickly form a clear, brown-orange colored solution. A catalyst was prepared by adding 45.01 g of alumina beads to the solution. The mixture was thoroughly mixed by hand swirling and shaking in a glass jar, followed by rotary evaporation at 70° C. under vacuum to remove most of the water, resulting in tan-brown colored beads. The beads were sieved over #30 sieve and then calcined from room temperature to 600° C. in 2 hours followed by a soak at 600° C. for 2 hrs. The resulting catalyst weighed 36.06 g and had 0.21 weight percent (wt %) of palladium based on the total weight of the catalyst (palladium and support medium).

Examples 1-5

A series of samples (each sample weighing about 40 g) of support medium (dried alumina beads) was used to prepare catalysts with varying weight percent loading of palladium based on the total weight of the catalyst. Physical vapor deposition (PVD) was used to deposit palladium onto the surface of the support medium. Each sample of alumina beads was placed in the PVD apparatus shown in FIGS. 2 and 3, except that blades (42) did not contain holes (44). The particle agitator (16) had a blade gap of 6.3 mm. The vacuum chamber (14) was then evacuated to a background pressure of about $5 \times 10^{-5}$ Torr (6.6 mPa) or less, and argon sputtering gas was admitted to the chamber at a pressure of about 10 mTorr (133.3 mPa). A mass flow controller with read out (obtained from MKS Instruments, Inc., Wilmington, Mass.) was used to control the flow rate of argon in the chamber, and the argon flow rate was kept at 47 standard cubic centimeter per minute (sccm). The palladium deposition process was then carried out by applying power to the palladium sputter target (32) for a pre-set period of time of 1 hour, with the particle agitator shaft (40) and blades (42) being rotated at 4 rpm. The duration of the palladium deposition process was 1 hour. The applied palladium sputter target power for Examples 1-5 was, respectively, 5, 15, 25, 100, and 200 Watts. After the palladium deposition process was completed, the vacuum chamber was vented with air to ambient conditions, and the resulting palladium-deposited samples were removed from the PVD apparatus. The amount of palladium deposited on each support medium (palladium (Pd) concentration) was determined as described above, and is shown in Table 1, below.

Catalysts prepared as described in Comparative Example A and Examples 1-5 were tested for palladium concentration determination and methane oxidation activity, as described above. The results are shown in Table 1, below. Palladium concentration results reflect the average palladium concentrations (weight percent) in the originally submitted samples. These concentrations have been corrected for impurities in the control samples. The reported uncertainties are one standard deviation of the duplicate measurements, rounded up to provide an appropriate number of significant figures for the average concentrations.

TABLE 1

| Examples | Sputter Target Power (Watts) | Pd concentration (wt %) | $T_{50}$ (° C.) | $T_{90}$ (° C.) |
|---|---|---|---|---|
| Comparative Example A | — | 0.21 | 444 | >500 |
| Example 1 | 5 | 0.008 | 432 | >500 |
| Example 2 | 15 | 0.017 | 410 | 493 |
| Example 3 | 25 | 0.041 | 377 | 449 |
| Example 4 | 100 | 0.143 | 352 | 424 |
| Example 5 | 200 | 0.316 | 339 | 403 |

Various modifications and alterations of this invention will become apparent to those skilled in the art without departing from the scope and spirit of this invention.

The invention claimed is:

1. An oxidizable-gas burner system comprising:
an oxidizable gas source,
a heat source, and
a catalyst system comprising:
 (i) an activating nanoporous support medium selected from the group consisting of an oxide of zirconium, an oxide of titanium, an oxide of manganese, an oxide of cerium optionally further comprising a mixture with aluminum oxide, and an oxide of a mixture of titanium, zirconium and manganese; and
 (ii) a palladium metal physically vapor deposited on the support medium;
wherein the oxidizable gas source is in fluid communication with the heat source and the catalyst system is situated proximate to the heat source, wherein the palladium metal is present at from 0.001 to 5 weight percent palladium based on the total weight of the palladium and the support medium.

2. The system according to claim 1, wherein the palladium metal is present from 0.04 to 0.5 weight percent palladium based on the total weight of the palladium and the support medium.

3. The system according to claim 1, wherein at least 95 percent by weight of the palladium based on the total weight of the palladium and the support medium is deposited on the surface of the support medium.

4. The system according to claim 3, wherein at least 99.5 percent by weight of the palladium based on the total weight of the palladium and the support medium is deposited on the surface of the support medium.

5. The system according to claim 1, wherein the palladium metal has an oxidation state selected from +2 and +4.

6. A method comprising:
providing a system according to claim 1, and
contacting the catalyst system with an oxidizable gas, wherein the T50 is below 400° C. and the palladium is present in an amount of from 0.001 to 5 weight percent palladium based on the total weight of the palladium and the support medium.

7. The method of claim 6, wherein the palladium is present in an amount of from 0.04 to 0.5 weight percent palladium based on the total weight of the palladium and the support medium.

* * * * *

UNITED STATES PATENT AND TRADEMARK OFFICE
CERTIFICATE OF CORRECTION

PATENT NO.        : 9,463,428 B2                                    Page 1 of 1
APPLICATION NO.   : 14/367537
DATED             : October 11, 2016
INVENTOR(S)       : Aaron Beaber It is certified that error appears in the above-identified patent and that said Letters Patent is hereby corrected as shown below:

On the Title Page

Column 2
(Other Publications), Delete "Engieering" and insert -- Engineering --, therefor.

In the Specification

Column 3
Line 10, After "medium" insert -- . --.

Signed and Sealed this
Ninth Day of May, 2017

Michelle K. Lee
*Director of the United States Patent and Trademark Office*